United States Patent
Kono

(10) Patent No.: US 8,184,501 B2
(45) Date of Patent: May 22, 2012

(54) SYSTEMS AND METHODS FOR STRETCHING CLOCK CYCLES IN THE INTERNAL CLOCK SIGNAL OF A MEMORY ARRAY MACRO

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 12/475,752

(22) Filed: Jun. 1, 2009

(65) Prior Publication Data

US 2010/0302896 A1 Dec. 2, 2010

(51) Int. Cl.
*G11C 8/00* (2006.01)
(52) U.S. Cl. .................................... 365/233.1
(58) Field of Classification Search ............... 365/194
See application file for complete search history.

(56) References Cited

U.S. PATENT DOCUMENTS

| | | | |
|---|---|---|---|
| 2003/0005345 A1* | 1/2003 | Fletcher et al. | 713/401 |
| 2010/0079164 A1* | 4/2010 | Kono | 326/9 |

* cited by examiner

*Primary Examiner* — Hoai V Ho
*Assistant Examiner* — Anthan Tran
(74) *Attorney, Agent, or Firm* — Law Offices of Mark L. Berrier

(57) ABSTRACT

Systems and methods for stretching clock cycles of the internal clock signal of a memory array macro to allow more time for a data access in the macro than the period of an external clock signal. In one embodiment, a local clock buffer in the memory array macro receives a regular periodic external clock signal and generates an internal clock signal. The local clock buffer includes a first signal path that has one or more faster-than-nominal components so that the first rising edge of the internal clock cycle occurs early than it would in a clock buffer with nominal components. When the memory array macro is active for a data access, the local clock buffer stretches a clock cycle of the internal clock signal so that the first and second half-periods of the internal clock cycle are each greater than the half-periods of the external clock signal.

18 Claims, 4 Drawing Sheets

SYSTEMS AND METHODS FOR STRETCHING CLOCK CYCLES IN THE INTERNAL CLOCK SIGNAL OF A MEMORY ARRAY MACRO

BACKGROUND

1. Field of the Invention

The invention relates generally to memory systems and more particularly to systems and methods for stretching clock cycles of the internal clock signal of a memory array macro to allow more time for a data access in the macro than the period of an external clock signal.

2. Related Art

There is a constant demand in the field of integrated circuit design for increased computational power, improved reliability, reduced cost, reduced power consumption and so on. These goals are achieved in various ways, such as by improving the physical characteristics of the devices. For example, computational power may be increased by developing components that can operate at higher clock speeds than previous components. Component sizes can also be reduced to provide additional computational power, as well as to reduce power consumption.

Size reductions and speed increases, however, are limited by such factors as available process technologies, noise, etc. These factors can, in turn, limit the performance of logic components and larger systems that incorporate these components, such as processors, memory systems, and the like. For example, the components that make up a memory system require some minimum amount of time to perform the various functions that are involved in a memory access (e.g., asserting/deasserting signals, switching transistors on/off, sensing data, etc.) If it is desired for the memory system to be able to perform one data access each clock cycle, the minimum required time to perform a data access the fines and minimum clock period, and consequently a maximum clock rate that can be used. Because it is difficult (and complicated) to design a memory system that uses a clock rate which is different than that used by other systems that access the memory (e.g., processors), this limits the speed of the other systems as well.

Various techniques have been used in an effort to alleviate this problem and to allow devices to operate at faster clock rates despite the limitations of the associated memory systems. For instance, some designs stretched the clock cycle that controlled memory accesses by buffering a global clock signal and passing data rising edge at the beginning of a clock cycle through to the memory system, but delaying the rising edge at the end of the clock cycle. As a result, the period of the clock cycle seen in the memory system was longer than the period of the global clock signal. The global clock signal could therefore be increased to a speed that was higher than could actually be used (without modification) by the memory system. There are, however, limits to the delay that can be accommodated in stretching the internal clock cycle without causing errors in the interaction between the memory system and the other systems of the device.

It would therefore be desirable to provide systems and methods for allowing even faster clock rates to be used external to the memory system, while still allowing the memory system sufficient time to access data in a single clock cycle.

SUMMARY OF THE INVENTION

One or more of the problems outlined above may be solved by the various embodiments of the invention. Broadly speaking, the invention includes systems and methods for stretching clock cycles of the internal clock signal of a memory array macro to allow more time for a data access in the macro than the period of an external clock signal One embodiment comprises a local clock buffer in a memory array macro. The local clock buffer receives a regular periodic external clock signal and generates an internal clock signal. When the memory array macro is active for a data access, the local clock buffer stretches a clock cycle of the internal clock signal so that the first and second half-periods of the internal clock cycle are each greater than the half-periods of a corresponding cycle of the external clock signal. The local clock buffer includes a first signal path that has one or more faster-than-nominal components so that the first rising edge of the internal clock cycle occurs early than it would using a conventional clock buffer with nominal components. The local clock buffer includes a second signal path that has a delay element as used in some conventional clock buffers.

The faster-than-nominal components of the first signal path may be larger than nominal components (e.g., fanout-2 instead of fanout-4), they may have optimized threshold voltages (e.g., a lower threshold voltage for a rising-edge input signal), or they may have optimized PN ratios (which affect their threshold voltages). One or more of the components of the first signal path may be faster-than-nominal. In one embodiment, the first signal path has an OR gate followed by a pair of serially connected inverters.

Another embodiment comprises a memory system having multiple memory array macros. The memory array macros in this embodiment all receive a global external clock signal, and each memory array macro generates its own internal clock signal which is independent of the internal clock signals of the other memory array macros. Each memory array macro generates its internal clock signal using a corresponding local clock buffer that may be configured as described above, so that the first and second half-periods of the internal clock cycle are each greater than the half-periods of a corresponding cycle of the global clock signal.

Yet another embodiment comprises a method for generating an internal clock signal in a memory array macro. The method includes the steps of receiving a regular periodic external clock signal and generating an internal clock signal. For a clock cycle of the external clock signal during which the memory array macro is accessed, a corresponding clock cycle of the internal clock signal is generated. The first half-period between the first rising edge and the falling edge of the internal clock cycle is greater than the first half-period of the corresponding external clock cycle. The second half-period between the falling edge and the first rising edge of the internal clock cycle may also be greater than the second half-period of the corresponding external clock cycle. The internal clock cycle may be generated so that the first rising edge of the internal clock cycle has a greater slew rate than the first rising edge of the corresponding clock cycle of the external clock signal.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
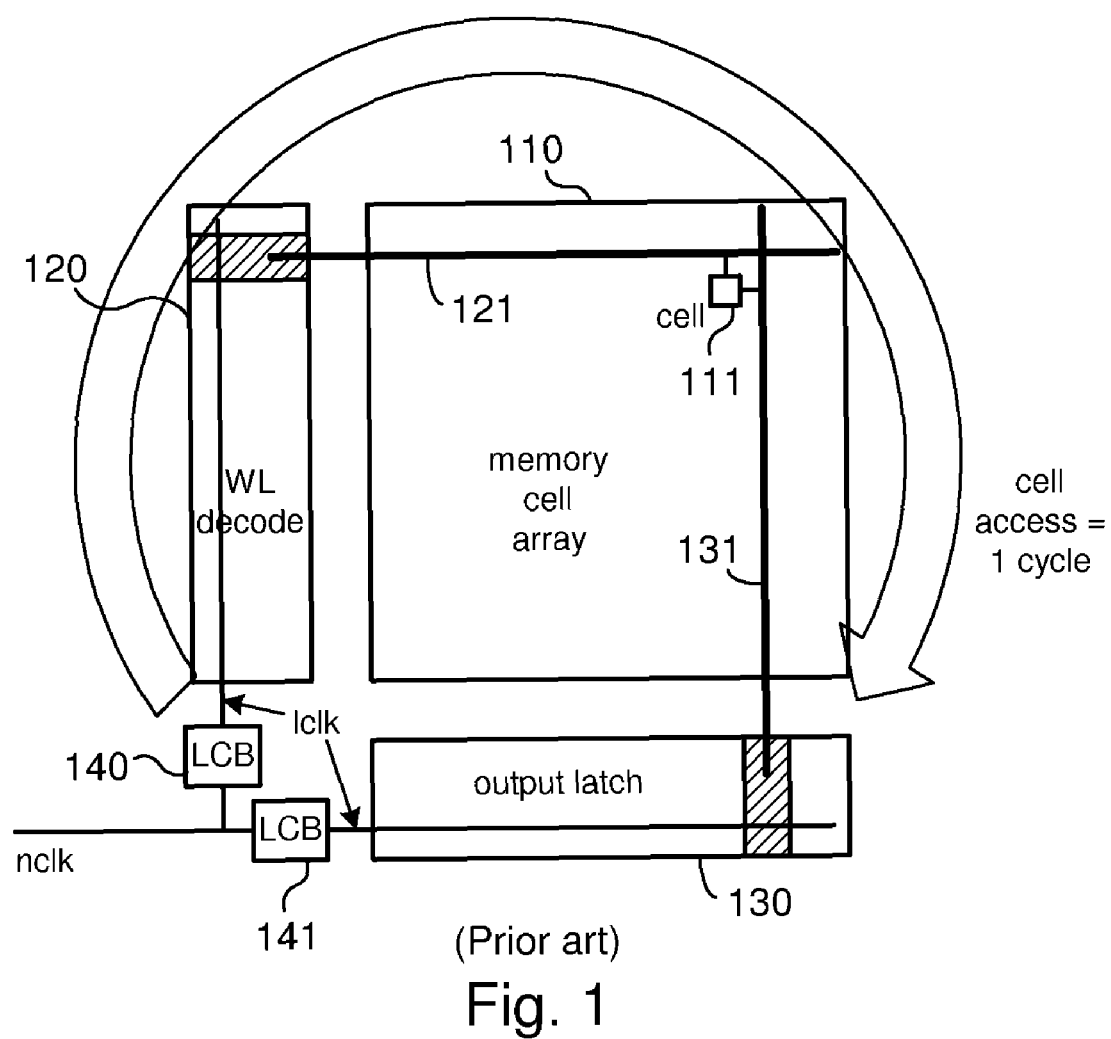
FIG. 1 is a diagram illustrating a memory array macro in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for stretching clock cycles of the internal clock signal of a memory array macro to allow more time for a data access in the macro than the period of an external clock signal.

Referring to FIG. 1, a diagram illustrating a memory array macro is shown. A memory array macro is a block of memory cells and associated circuitry that enables access to the memory cells. In FIG. 1, the memory array macro includes memory cell array 110, decode logic 120, output latches 130 and local clock buffers 140 and 141. There are typically many individual memory array macros in a single memory system.

Memory cell array 110 includes an array of memory cells such as cell 111. Each cell stores a corresponding bit of data. A row of cells in the array store the bits of a data word. The array has multiple rows of cells and consequently stores multiple data words. The memory cells are typically accessed a row at a time to read or write entire data words.

When it is desired to read data from memory cell array 110, a signal (act) is provided to the memory array macro to activate it. Local clock buffer 140 receives this signal, as well as external clock signal nclk, and generates an internal clock signal (at least one cycle) that is provided to decode logic 120. Decode logic 120 also receives a word address that identifies the particular row in the memory cell array that is to be accessed. Decode logic 120 decodes the address and asserts a word select signal on the word line (e.g., 121) corresponding to the decoded address. The word select signal is asserted at the first rising edge of the internal clock signal. The memory array macro is active for one clock cycle that goes from a first rising edge to a second rising edge. When the word line for the cell is asserted, the cell is coupled to the bit line (e.g., 131) so that the data in the cell is conveyed to the bit line. The bit line provides the data to a corresponding one of a set of output latches 130. When the second rising edge of the internal clock signal occurs, the data is stored in the output latch. The data is then provided from the output latch to the component or subsystem that requested the data (e.g., a microprocessor).

Figure 2A:
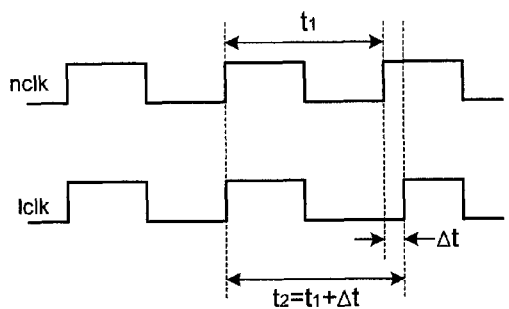
FIGS. 2A and 2B are diagrams illustrating the timing of the rising edges in the external clock signal and the internal clock signal in prior art local clock buffers.
Figure 2B:
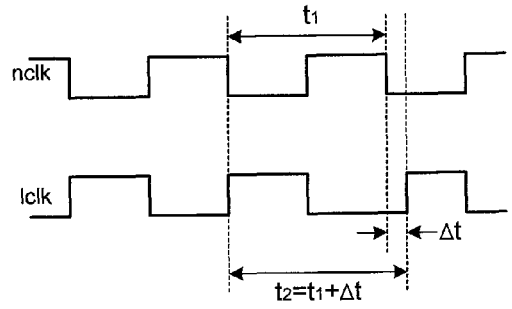

Referring to FIGS. 2A and 2B, a pair of diagrams illustrating the timing of the rising edges in the external clock signal and the internal clock signal in a pair of prior art systems are shown. FIG. 2A shows the clock signals associated with a positive clock buffer, while FIG. 2B shows the clock signals associated with a negative clock buffer. The positive clock buffer maintains the orientation of the external clock signal (i.e., a rising edge in the external clock signal produces a rising edge in the internal clock signal). The negative clock buffer inverts the internal clock signal (i.e., a rising edge in the external clock signal produces a falling edge in the internal clock signal).

Each of FIGS. 2A and 2B includes two waveforms. The waveform at the top of each figure represents the external clock signal, nclk. The waveform at the bottom of each figure represents the internal clock signal, lclk. External clock signal nclk is a regular, periodic square wave having a period $t_1$. (As will be discussed in more detail below, the waveform is not a perfect square wave, but instead has rising and falling edges which are sloped.) That is, the interval between each successive rising edge (or each successive falling edge) is $t_1$. Internal clock signal lclk is also a square wave, but the period of a clock cycle can be stretched so that it is greater than $t_1$. In particular, during a clock cycle in which a memory array macro is accessed, the clock buffers for the macro stretch the clock cycle so that the macro has a greater amount of time (i.e., more than $t_1$) to access the data in the selected cells. As a result, the system can be operated at a clock rate (the rate of nclk) which is faster than the maximum clock rate at which the memory array macro can operate.

The clock cycle of the internal clock signal is stretched by processing the first and second rising edges of the external clock signal through two different signal paths within the local clock buffer. The first rising edge is processed by a first signal path, while the second rising edge is processed by a second signal path. The first signal path buffers the signal, but does not delay the signal (except as will be described below). The second signal path, on the other hand, buffers the signal, and also delays the signal by some additional amount of time, $\Delta t$. Thus, in the internal clock signal, the clock period (between the first and second rising edges in the positive internal clock signal, or between the first and second falling edges in the negative internal clock signal) is $t_2 = t_1 + \Delta t$.

It should be noted that any signal which passes through a logic gate requires some amount of time to propagate from the input(s) of the gate to the output(s) of the gate. This delay is inherent in the gate, and is not considered to be part of the additional delay, $\Delta t$, described above. In the figures of the present disclosure which illustrate the timing of internal clock signals in comparison to external clock signals, this inherent delay will be disregarded, so a rising/falling edge of the internal clock signal which is delayed only by the inherent delay will be depicted as occurring at the same time as the corresponding rising/falling edge of the external clock signal. The delay in inherent in the nominal components of the local clock buffer may be referred to below as a nominal delay in order to distinguish this delay from the additional delay resulting from the use of a delay component (which is used specifically for the purpose of providing the additional delay).

Figure 3A:
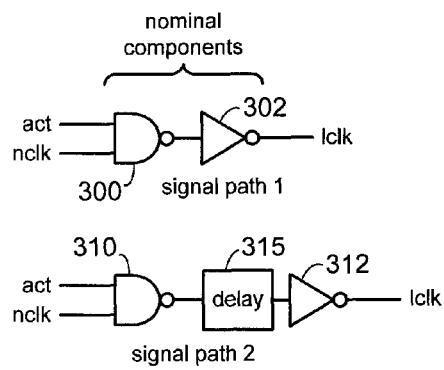
FIGS. 3A and 3B are diagrams illustrating the components that form the first and second signal paths in local clock buffers of conventional memory array macros.
Figure 3B:
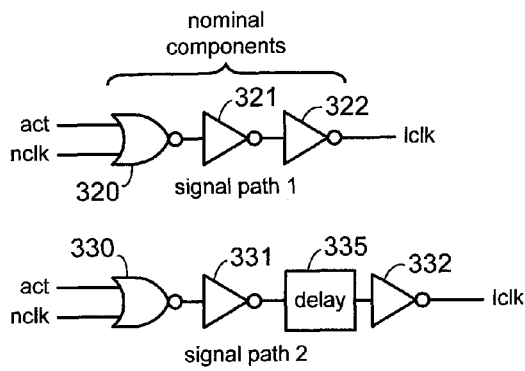

Referring to FIGS. 3A and 3B, the components that form the first and second signal paths in a pair of local clock buffers of a conventional memory array macro are shown. FIG. 3A shows the components for a positive local clock buffer, such as would produce the internal clock signal shown in FIG. 2A. FIG. 3B shows the components for a negative local clock buffer, such as would produce the internal clock signal shown in FIG. 2B.

At the top of each figure are the components of the first signal path, and the bottom of each figure shows the components of the second signal path. The additional clock buffer circuitry that switches between the first and second signal paths to produce a single internal clock signal is known in the art and consequently is not described in detail herein.

Referring to FIG. 3A, the first signal path consists of a NAND gate 300 and an inverter 302 connected in series. NAND gate 300 receives the external clock signal nclk and an active signal (act) as inputs. The act signal is asserted high when the memory array macro is active. Otherwise, the act signal is deasserted (low). Consequently, when the act signal is asserted, NAND gate 300 inverts nclk and passes it to inverter 302. The inverter inverts and buffers the signal and then provides the signal to the other components of the memory array macro.

The second signal path has a similar construction and consists of a NAND gate 310 and an inverter 312. The second signal path, however, also includes a delay element 315. Delay element 315 is provided only for the purpose of increasing the amount of time required for signals to propagate through the second signal path—it the does not otherwise affect the signal. NAND gate 310 receives the same inputs as NAND gate 300—external clock signal nclk and active signal act. As a result, when the act signal is asserted, NAND gate 310 passes inverted nclk through to delay element 315. Delay element 315 delays the signal by an amount of time $\Delta t$ and passes it to inverter 312, which buffers the signal and inverts it before passing it to the other components of the memory array macro.

Referring to FIG. 3B, the first signal path consists of a NOR gate 320 and two inverters (321, 322) connected in series. NOR gate 320 receives the external clock signal nclk and an active signal (act) as inputs. The act signal is asserted low when the memory array macro is active. Otherwise, the act signal is deasserted (high). Consequently, when the act signal is asserted, NOR gate 320 passes nclk through to inverters 321 and 322. The inverters buffer the signal and then provide the signal to the other components of the memory array macro.

The second signal path has a similar construction and consists of a NOR gate 330 and two inverters, 331 and 332. The second signal path, however, also includes a delay element 335. Delay element 335 is again provided for the purpose of increasing the amount of time required for signals to propagate through the second signal path—it the does not otherwise affect the signal. NOR gate 330 receives the same inputs as NOR gate 320—external clock signal nclk and active signal act. As a result, when the act signal is asserted, NOR gate 330 passes nclk through to inverter 331, which buffers and inverts the signal and passes it to delay element 335. Delay element 335 delays the signal by an amount of time $\Delta t$ and passes it to inverter 332, which buffers the signal and inverts it again before passing it to the other components of the memory array macro.

Figure 4:
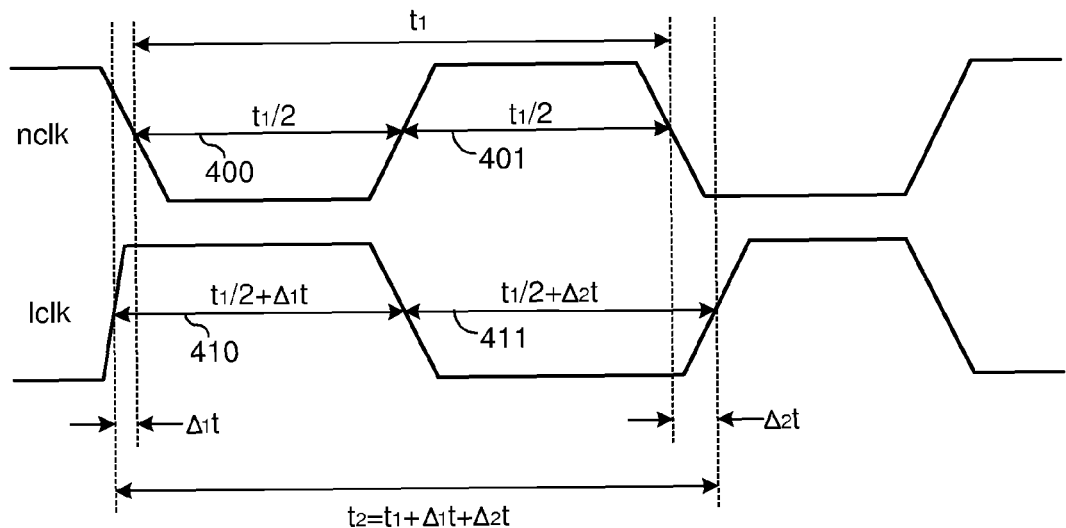
FIG. 4 is a diagram illustrating the timing of the rising edges of the internal and external clock signals in accordance with one embodiment of the present invention.

As noted above, it would be desirable to further extend the period of the internal clock cycle during data accesses. Referring to FIG. 4, a diagram illustrating the timing of the rising and falling edges of the internal and external clock signals in accordance with one embodiment is shown. The illustrated waveforms are for a negative local clock buffer, so rising edges in the external clock signal produce falling edges in the internal clock signal, and falling edges in the external clock signal produce rising edges in the internal clock signal.

At the top of FIG. 4 is a waveform which represents a regular periodic external clock signal, nclk. At the bottom of the figure is a waveform which represents an internal clock signal, lclk. One of the clock cycles of internal clock signal lclk is stretched, not only by delaying the second rising edge of the clock cycle, but also by causing the first rising edge of the clock cycle to occur earlier than it would have occurred in a conventional system. Consequently, the period of the stretched internal clock cycle in FIG. 4 is greater than the period of the stretched internal clock cycle in FIG. 2B (assuming the same external clock cycle, $t_1$).

While the second rising edge of the stretched clock cycle can be shifted to the right in the diagram simply by delaying the second rising edge as described above, this technique obviously cannot be used to shift the first rising edge to the left. This is instead accomplished by designing the first signal path (the signal path that processes external clock signal nclk to generate the first rising edge) so that the components of this signal path are faster than those of a conventional clock buffer. The faster components react more quickly to inputs (i.e., their outputs change more quickly in response to changes in their inputs), increasing the slope of signal transitions (also referred to as a slew rate) in the internal clock signal, and potentially also decreasing the propagation delay through the signal path so that it is less than the propagation delay through the corresponding conventionally designed signal path. The faster-than-nominal components will be discussed in more detail below. Generally speaking, the speed of the components can be increased by using larger-than-nominal components, using components that have lower threshold voltages, or optimizing the PN ratios of the components.

The result of using the faster-than-nominal components in the first signal path is that the first half-period (410) of the internal clock signal is greater than the first half-period (400) of the external clock cycle. While the first half-period (400) of the external clock cycle is $t_1/2$, the first half-period (410) of the internal clock signal is $(t_1/2)+\Delta_1 t$, where $\Delta_1 t$ is the difference in the time it takes for the faster-than-nominal first signal path to react to the falling edge of nclk and the time it takes for the conventional first signal path (using nominal components) to react to the falling edge of nclk.

The second half-period (411) of the internal clock signal is $(t_1/2)+\Delta_2 t$, where $\Delta_2 t$ is the additional delay imparted by the delay element in the second signal path. The second half-period (411) of the internal clock signal is the same as the second half-period of the internal clock signal in a conventional system. The entire period of the internal clock cycle in FIG. 4 is therefore $t_2=t_1+\Delta_1 t+\Delta_2 t$, as compared to $t_1+\Delta_2 t$ for the conventional local clock buffer.

It should be noted that a half-period, as used herein, is the interval between a rising edge and the subsequent falling edge, or a falling edge and the subsequent rising edge, of a clock cycle. Thus, the first half-period of a clock cycle in the internal clock signal of a local clock buffer (as shown in FIG. 4) is the interval between the first rising edge of the clock cycle and the falling edge in the middle of the clock cycle. The second half-period of the clock cycle is the interval between the falling edge in the middle of the clock cycle and the second rising edge of the clock cycle. The edges are considered for this purpose to occur at the times at which the clock signal voltage crosses the midpoint between binary 0 and binary 1 (e.g., Vdd/2).

Figure 5:
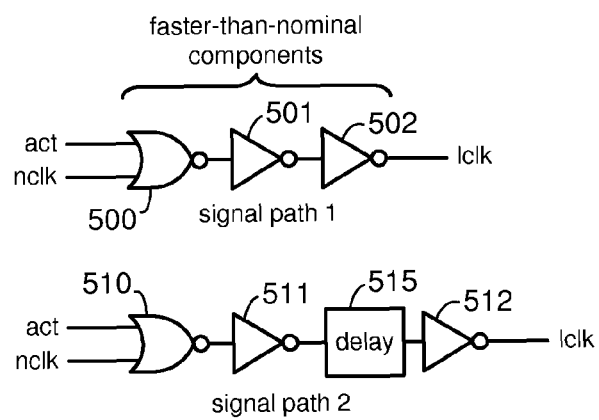
FIG. 5 is a diagram illustrating the structure of first and second signal paths in a local clock buffer in accordance with one embodiment of the present invention.

Referring to FIG. 5, a diagram illustrating the structure of first and second signal paths in a local clock buffer in accordance with one embodiment of the present invention is shown. The components of the first signal path (which is used to generate the first rising edge of the internal clock cycle) are depicted at the top of the figure, and the components of the second signal path (which is used to generate the second rising edge of the internal clock cycle) are depicted at the bottom of the figure.

Like the conventional negative local clock buffer structure, the first signal path in FIG. 5 consists of a NOR gate 500 and two inverters (501, 502) connected in series. NOR gate 500 receives the external clock signal nclk and the active signal act as inputs. The output of NOR gate 500 is passed through inverters 501 and 502 to buffer the internal clock signal before providing it to the other components (e.g., WL decoder) of the memory array macro. The first signal path of FIG. 5 passes nclk through to the components of the memory array macro when the act signal is asserted (low), and maintains the internal clock signal at 0 when the act signal is not asserted (high).

The structure of FIG. 5 is unlike the conventional structure in that one or more of the components of the first signal path are faster than nominal components. "Nominal", as used herein, refers to components that utilize standard or typical parameters for the system. For example, if a system is manufactured using process technologies that are capable of 100 nm resolution, a standard or typical component in the system will have 100 nm features (rather than larger features) in order to minimize the size and power consumption of the system. A component that has features which are greater-than-nominal (e.g., 200 nm) would normally require more space and power, and typically is not used.

As in conventional systems, embodiments of the present invention may include both negative clock buffers, as described in connection with FIGS. 4 and 5, and positive clock buffers. Embodiments that comprise positive clock buffers may have structures and behavior similar to the conventional structures and behavior illustrated in FIGS. 2A and 3A, but will include faster-than-nominal components as described in connection with FIG. 5, resulting in internal clock cycles having increased first half-periods as described in connection with FIG. 4.

In the present systems and methods, non-nominal (faster-than-nominal) components are used to achieve the goal of increased propagation speed in the first signal path. The number of components affected is very low—the components of the memory array macro other than the local clock buffer and components external to the memory array macro are not affected. The overall increase in space and power consumption is therefore very low, and is outweighed by the benefit of the increased internal clock cycle period in the memory array macro.

The components of the first signal path can be made to react more quickly (can be made faster than nominal components) in several ways. For example, the faster-than-nominal components may be made larger than nominal components. Typically, a nominal component output will provide a four gate fanout. This means the component drives four inputs of other components. If the fanout of the component is less, its output is required to drive fewer inputs of other components, and the output signal makes transitions (from 0 to 1 or from 1 to 0) more rapidly. One embodiment of the present system therefore uses a fanout of 2 ("fanout-2") rather than a more typical conventional fanout of 4 ("fanout-4").

The components of the first signal path can also be made faster than nominal components by optimizing their threshold voltages. Logic gates (including inverters) have a threshold voltage, below which input signals are considered to be binary 0's, and above which input signals are considered to be binary 1's. Because it is desired to make NOR gate 500 react more quickly to the falling edges of the nclk input, the threshold voltage of the NOR gate can be increased. This will cause the output of the NOR gate to change sooner because the voltage of nclk decreases at falling edges—the higher threshold voltage will therefore be reached before the nominal threshold voltage, causing an earlier transition of the NOR gate output. It is desirable to have inverter 501 react more quickly to a rising edge (the falling edge of nclk causes a rising edge at the output of NOR gate 500). A reduction in the threshold voltage of inverter 501 will therefore cause this inverter to react more quickly for similar reasons as NOR gate 500. Because the input of inverter 502 is inverted with respect to input of inverter 501, it is desired to have the inverter react more quickly to falling edges. An increase in the threshold voltage of inverter 502 will therefore cause this inverter to react more quickly to falling edges of nclk (which cause falling edges at the input of inverter 502).

The components of the first signal path can also be made faster than nominal components by optimizing their PN ratios. The PN ratio of a logic gate is the ratio of p-type transistors to n-type transistors through which current must flow in the logic gate. Because the PN ratio affects the threshold voltage of the gate, it can affect the speed of the gate (i.e., whether the gate responds more quickly or more slowly than a nominal gate). The affect of PN ratio on the threshold voltage of the gate is explained in more detail in U.S. patent application Ser. No. 12/243,140, the disclosure of which is hereby incorporated by reference.

As few as one, or as many as all of the components in the first signal path can be faster-than-nominal components. Of the three components shown in FIG. 5, the components may be prioritized as follows: first, inverter 501; then NOR gate 500; then inverter 502. Thus, if one component is faster-than-nominal, it should be inverter 501. If two components are faster-than-nominal, they should be inverter 501 and NOR gate 500. Inverter 501 is prioritized first because inverter 502 has to drive the gates in the WL decoder and is typically larger than inverter 501. Increasing the size of inverter 501 is therefore likely to have greater effect than increasing the size of inverter 502. Trade-offs between power and performance indicate that increasing the size of inverter 501 will be more effective than increasing the size of NOR gate 500. Increasing the size of OR gate 500 should, however, have greater effect than increasing the size of inverter 502.

The second signal path of FIG. 5 can be constructed in the same manner as the second signal path of FIG. 3 using nominal components. The second signal path is therefore depicted using NOR gate 510, two inverters, 511 and 502, and delay element 515. Delay element 515 can be designed to provide any required delay using nominal components.

The embodiments of the invention may include a local clock buffer for a memory array macro, where the clock buffer implements the faster-than-nominal first signal path described above. Another embodiment may comprise a memory system that includes multiple memory array macros, each of which receives a common external clock signal (nclk) and generates its own internal clock signal. The different memory array macros each stretch the clock periods of their own internal clock cycles as described above, but each macro does so independently of the others.

Another embodiment comprises a method for stretching the period of an internal clock cycle of a memory array macro in the manner described above. The method may include receiving a regular periodic external clock signal and generating an internal clock signal for the memory array macro, where the first half-period of the internal clock cycle is greater than the first half-period of the corresponding external clock cycle. The first half-period of the internal clock cycle is stretched by processing the first rising edge of the external clock cycle through a first signal path having faster-than-nominal components. The method may also include stretching the second half-period of the internal clock cycle so that it is greater than the second half-period of the corresponding external clock cycle. The second half-period of the internal clock cycle is stretched by processing the second rising edge of the external clock cycle through a second signal path that includes a delay component.

Figure 6:
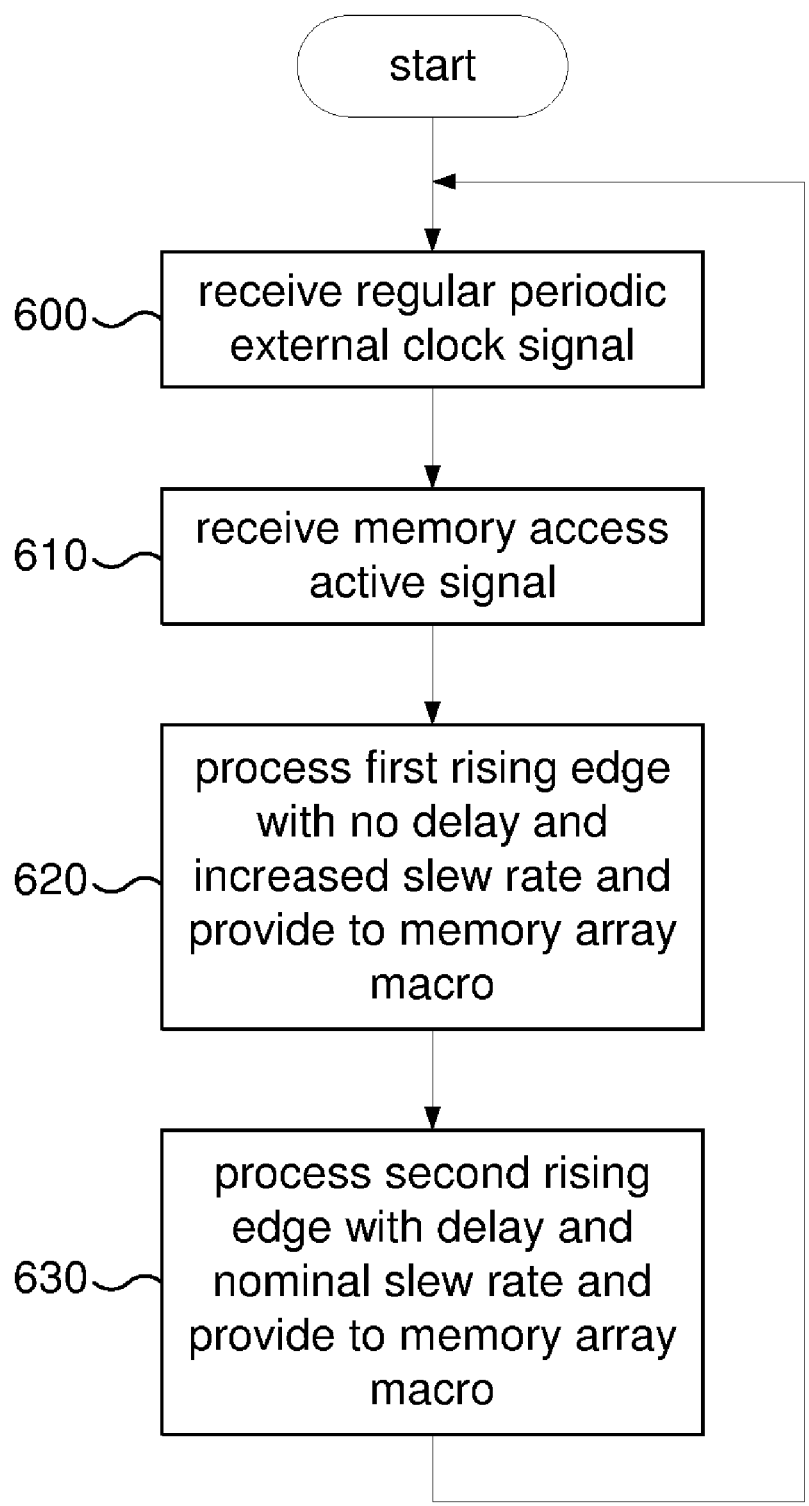
FIG. 6 is a flow diagram illustrating a method in accordance with one embodiment of the present invention.

A method in accordance with one embodiment is illustrated in the flow diagram of FIG. 6. In this figure, a local clock buffer for a memory array macro receives a regular periodic external clock signal (600), as well as an active signal (610) indicating that the memory array macro is being accessed. The local clock buffer processes the first rising edge of a clock cycle of the external clock signal with no delay other than the inherent delay and increases the slew rate of the first rising edge of the internal clock cycle (620). The falling edge of the external clock cycle may be processed with or without faster-than-nominal components and with or without delays. The local clock buffer processes the second rising edge of the external clock cycle with nominal components and with an added delay (630).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. For example, while the embodiments described above are designed to access the memory array macro on the rising edges of the clock signals, other embodiments may be designed to access the memory array macro on the falling edges of the clock signals. This would require modifications that are opposite those described above with respect to threshold voltages and PN ratios. Still other variations may be apparent to those skilled in the art. Alternative embodiments could also use different combinations of logic gates in the first and second signal paths to generate the desired rising/falling edges (e.g., a NOR gate followed by a single inverter, or an AND gate followed by two inverters, or a NAND gate followed by a single inverter).

Thus, the present invention is not intended to be limited to the embodiments explicitly shown herein but is to be accorded the widest scope consistent with the principles and novel features disclosed herein and recited within the following claims.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A local clock buffer for memory cell accesses comprising:
   a first set of components that form a first signal path and a second set of components that form a second signal path;
   an external clock input configured to receive an external clock signal and to provide the external clock signal to the first and second signal paths; and
   an internal clock output configured to receive signals from the first and second signal paths and to provide an internal clock signal to components of a memory cell macro;
   wherein the first signal path includes one or more faster-than-nominal components;
   wherein the local clock buffer generates a clock cycle of the internal clock signal which has a first half-period that is greater than a corresponding first half-period of a clock cycle of the external clock signal; and
   wherein the first signal path generates an initial edge of the clock cycle of the internal clock signal and the second signal path generates a final edge of the clock cycle of the internal clock signal.

2. The local clock buffer of claim 1, wherein the second signal path includes a delay element, and wherein the clock cycle of the internal clock signal has a second half-period that is greater than a corresponding second half-period of the clock cycle of the external clock signal.

3. The local clock buffer of claim 1, wherein at least one of the faster-than-nominal components comprises a larger-than-nominal component.

4. The local clock buffer of claim 3, wherein the larger-than-nominal component comprises a fanout-2 component.

5. The local clock buffer of claim 1, wherein at least one of the faster-than-nominal components has a threshold voltage that is less than a nominal threshold voltage.

6. The local clock buffer of claim 5, wherein the nominal threshold voltage is Vdd/2.

7. The local clock buffer of claim 1, wherein at least one of the faster-than-nominal components has a PN ratio that is less than a nominal PN ratio.

8. The local clock buffer of claim 1, wherein the first signal path includes: an OR gate configured to receive the external clock signal as a first input; a first inverter configured to receive an output of the OR gate and to provide a first inverter output; and a second inverter configured to receive the first inverter output and to provide a second inverter output, wherein the one or more faster-than-nominal components comprise at least one of: the OR gate; the first inverter; and the second inverter.

9. A method for generating an internal clock signal in a memory array macro comprising:
   receiving a regular periodic external clock signal at an input of a local clock buffer for a memory array macro; and
   providing the external clock signal to first and second signal paths within the local clock buffer, wherein the first signal path includes one or more faster-than-nominal components;
   providing an internal clock signal at an output of the local clock buffer;
   wherein for a clock cycle of the external clock signal during which the memory array macro is accessed, a corresponding clock cycle of the internal clock signal is generated, wherein the first signal path generates an initial edge of the clock cycle of the internal clock signal and the second signal path generates a final edge of the clock cycle of the internal clock signal, wherein a first half-period of the clock cycle of the internal clock signal is greater than a half-period of the external clock signal, and wherein a second half-period is greater than the half-period of the external clock signal.

10. The method of claim 9, further comprising generating the first rising/falling edge of the clock cycle of the internal clock signal with a greater slew rate than a first rising/falling edge of the corresponding clock cycle of the external clock signal.

11. The method of claim 9, further comprising generating the second rising/falling edge of the clock cycle of the internal clock signal by delaying the second rising/falling edge of the clock cycle of the internal clock signal with respect to a second rising/falling edge of the corresponding clock cycle of the external clock signal.

12. The method of claim 9, wherein the local clock buffer generates the first rising/falling edge of the clock cycle of the internal clock signal using faster-than-nominal buffer components and generates the second rising/falling edge of the clock cycle of the internal clock signal using only nominal buffer components, and wherein the resulting slew rate of the first rising/falling edge of the clock cycle of the internal clock signal is greater than the slew rate of the first rising/falling edge of the clock cycle of the external clock signal.

13. The method of claim 12, wherein the faster-than-nominal buffer components comprise fanout-2 components and nominal buffer components comprise fanout-4 components.

14. The method of claim 12, wherein the faster-than-nominal buffer components have threshold voltages that are lower than threshold voltages of nominal buffer components.

15. The method of claim 12, wherein the faster-than-nominal buffer components have PN ratios that are closer to 1 than PN ratios of nominal buffer components.

16. The method of claim 9, wherein the local clock buffer delays the second rising/falling edge of the clock cycle of the internal clock signal with respect to the second rising/falling edge of the clock cycle of the external clock signal.

17. The local clock buffer of claim 1, wherein a word select signal of the memory cell macro is asserted at the initial edge of the clock cycle of the internal clock signal, and wherein data is stored in an output latch of the memory cell macro at the final edge of the clock cycle of the internal clock signal.

18. The local clock buffer of claim 1, wherein the second signal path includes only nominal components.

* * * * *